(12) United States Patent
Hsu et al.

(10) Patent No.: US 6,808,169 B2
(45) Date of Patent: Oct. 26, 2004

(54) NON-VOLATILE MEMORY WITH CROWN ELECTRODE TO INCREASE CAPACITANCE BETWEEN CONTROL GATE AND FLOATING GATE

(75) Inventors: Fu-Chieh Hsu, Saratoga, CA (US); Wingyu Leung, Cupertino, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 174 days.

(21) Appl. No.: 09/948,163

(22) Filed: Sep. 6, 2001

(65) Prior Publication Data

US 2002/0008271 A1 Jan. 24, 2002

Related U.S. Application Data

(60) Division of application No. 09/444,002, filed on Nov. 19, 1999, now Pat. No. 6,329,240, which is a continuation-in-part of application No. 09/415,032, filed on Oct. 7, 1999, now Pat. No. 6,457,108.

(51) Int. Cl.[7] .............................................. H01L 29/76
(52) U.S. Cl. ..................... 267/315; 257/316; 257/317; 257/318; 365/185.01; 365/185.02; 365/185.04
(58) Field of Search ............................... 257/314–316; 365/185.01, 185.02, 185.03, 185.04, 185.05, 185.06, 185.3, 185.33

(56) References Cited

U.S. PATENT DOCUMENTS

| | | |
|---|---|---|
| 4,811,076 A | 3/1989 | Tigelaar et al. |
| 5,108,941 A | 4/1992 | Patterson et al. |
| 5,198,995 A | 3/1993 | Dennard et al. |
| 5,301,150 A | 4/1994 | Sullivan et al. |
| 5,365,486 A | 11/1994 | Schreck |
| 5,394,365 A | 2/1995 | Tsukikawa |
| 5,414,671 A | 5/1995 | Fukumoto |
| 5,504,706 A | 4/1996 | D'Arrigo et al. |
| 5,511,020 A | 4/1996 | Hu et al. |
| 5,600,598 A | 2/1997 | Skjaveland et al. |
| 5,694,355 A | 12/1997 | Skjaveland et al. |
| 5,696,036 A | 12/1997 | Su et al. |
| 5,699,297 A | 12/1997 | Yamazaki et al. |
| 5,700,708 A | 12/1997 | Chen et al. |
| 5,723,355 A | 3/1998 | Chang et al. |
| 5,736,764 A | 4/1998 | Chang |
| 5,739,566 A * | 4/1998 | Ota ............................ 257/315 |
| 5,761,126 A | 6/1998 | Chi et al. |
| 5,783,470 A | 7/1998 | Rostoker |
| 5,879,990 A | 3/1999 | Dormans et al. |
| 5,953,255 A | 9/1999 | Lee |
| 6,060,403 A | 5/2000 | Yasuda et al. |
| 6,064,595 A | 5/2000 | Logie et al. |
| 6,102,963 A | 8/2000 | Agrawal |
| 6,145,069 A | 11/2000 | Dye |
| 6,147,914 A * | 11/2000 | Leung et al. .......... 365/189.09 |
| 6,180,453 B1 | 1/2001 | Sung et al. |
| 6,211,007 B1 | 4/2001 | Prall et al. |
| 6,218,234 B1 | 4/2001 | Yu et al. |
| 6,232,631 B1 | 5/2001 | Schmidt et al. |
| 6,278,159 B1 | 8/2001 | Patelmo et al. |
| 6,282,123 B1 | 8/2001 | Mehta |
| 6,329,240 B1 | 12/2001 | Hsu et al. |

* cited by examiner

Primary Examiner—Minhloan Tran
Assistant Examiner—Thomas L Dickey
(74) Attorney, Agent, or Firm—Bever, Hoffman & Harms, LLP; E. Eric Hoffman

(57) ABSTRACT

A non-volatile memory (NVM) system includes a NVM cell having: a semiconductor region having a first conductivity type; a gate dielectric layer located over the semiconductor region; a gate electrode located over the gate dielectric layer; a source region and a drain region of a second conductivity type, opposite the first conductivity type, located in the semiconductor region and aligned with the gate electrode; a crown electrode having a base that contacts the gate electrode and walls that extend vertically from the base region, away from the gate electrode; a dielectric layer located over the crown electrode, wherein the dielectric layer extends over at least interior surfaces of the walls; and a plate electrode located over the dielectric layer, wherein the plate electrode extends over at least interior surfaces of the walls.

14 Claims, 13 Drawing Sheets

| | WL | BL | VG | N-WELL | P-SUB |
|---|---|---|---|---|---|
| PROGRAM MODE (PROGRAM CELL 200) | | | | | |
| CELL 200 | 0 V | 6.5 V | 6.5 V | 6.5 V | 0 V |
| CELL 300 | 0 V | 3.0 V | 3.0 V | 6.5 V | 0 V |
| CELL 400 | 3.0 V | 6.5 V | 6.5 V | 6.5 V | 0 V |
| CELL 500 | 3.0 V | 3.0 V | 3.0 V | 6.5 V | 0 V |
| ERASE MODE | | | | | |
| ALL CELLS | 0 V | -6.5 V | -6.5 V | 0 V | 0 V |
| READ MODE (READ CELLS 200, 300) | | | | | |
| CELLS 200, 300 | 0 V | 0 V | 2.5 V | 3.0 V | 0 V |
| CELLS 400, 500 | 3.0 V | 0 V | 2.5 V | 3.0 V | 0 V |

FIG. 5

NON-VOLATILE MEMORY WITH CROWN ELECTRODE TO INCREASE CAPACITANCE BETWEEN CONTROL GATE AND FLOATING GATE

RELATED APPLICATIONS

The present application is a divisional of U.S. patent application Ser. No. 09/444,002 filed Nov. 19, 1999, now U.S. Pat. No. 6,329,240, which is a continuation-in-part of U.S. patent application Ser. No. 09/415,032 filed by Fu-Chieh Hsu and Wingyu Leung on Oct. 7, 1999, now U.S. Pat. No. 6,457,108.

FIELD OF THE INVENTION

The present invention relates to non-volatile memory (NVM). More particularly, this invention relates to NVM fabricated by slightly modifying a conventional logic process. In the present application, a conventional logic process is defined as a semiconductor process that implements single-well or twin-well technology and uses a single layer of polysilicon. This invention further relates to a method of operating a non-volatile memory to ensure maximum data retention time.

BACKGROUND OF INVENTION

For system-on-chip (SOC) applications, it is desirable to integrate many functional blocks into a single integrated circuit. The most commonly used blocks include a microprocessor or micro-controller, SRAM blocks, non-volatile memory blocks, and various special function logic blocks. However, traditional non-volatile memory processes, which typically use stacked gate or split-gate memory cells, are not compatible with a conventional logic process. The combination of a non-volatile memory process and a conventional logic process results in much more complicated and expensive "merged non-volatile memory and logic" process to implement system-on-chip integrated circuits. This is undesirable because the typical usage of the non-volatile memory block in an Soc application is comparatively small in relation to the overall chip size.

There are several prior art approaches to minimize the complexity of such a merged non-volatile memory and logic process. For example, U.S. Pat. No. 5,879,990 to Dormans et al. describes a process that requires at least two layers of polysilicon and two sets of transistors to implement both the normal logic transistors and the non-volatile memory transistors. This process is therefore more complex than a conventional logic process, which requires only a single layer of polysilicon.

U.S. Pat. No. 5,301,150 to Sullivan et al. describes a single poly process to implement a non-volatile memory cell. In this patent, the control gate to floating gate coupling is implemented using an n-well inversion capacitor. The control gate is therefore implemented using the n-well. An injector region must be coupled to the inversion layer in the n-well. The use of an n-well as the control gate and the need for an injector region result in a relatively large cell size.

U.S. Pat. No. 5,504,706 to D'Arrigo et al. describes a single poly process to implement a non-volatile memory cell that does not use an n-well as a control gate. FIG. 1A is a schematic diagram illustrating an array of non-volatile memory cells C00–C11 as described by D'Arrigo et al. FIG. 1B is a cross sectional view of one of these non-volatile memory cells. As shown in FIG. 1A, each of the memory cells contains a transistor 24 having a source connected to a virtual-ground (VG) line and a drain connected to a bit line (BL). The transistor 24 further has a floating gate 40 which is coupled to a word line (WL) 86 through a coupling capacitor. The coupling capacitor includes n+ region 80, which is located under the floating gate 40 and which is continuous with the diffusion word line 86. The capacitance of the coupling capacitor is significantly larger than the gate capacitance of the transistor to allow effective gate control of the transistor from the WL voltage levels. The n+ region 80 is formed by an additional implant to ensure good coupling during operations. This additional implant is not available in a standard logic process. The memory cells 24 are located inside a triple-well structure. More specifically, the memory cells are formed in a p-tank 78, which in turn, is formed in an n-tank 76, which in turn, is formed in p-well 74. A p+ contact region 88 is located in p-tank 78, and an n+ contact region 90 is located in n-tank 76. The triple-well structure allows flexibility of biasing in operating the memory cell. More specifically, the triple-well structure allows a large negative voltage (typically -9 Volts) to be applied to the word line 86 (i.e., the control gate). Both the extra n+ implant and the triple-well are not available in a conventional logic process. Similarly, U.S. Pat. No. 5,736,764 to Chang describes a PMOS cell having both a select gate and a control gate, wherein additional implants are required underneath the control gate.

In addition, the above-described non-volatile memory cells use a relatively thick tunneling oxide (typically 9 nanometers or more). Such a thick tunneling oxide is not compatible with conventional logic processes, because conventional logic processes provide for logic transistors having a gate oxide thickness of about 5 nm for a 0.25 micron process and 3.5 nm for a 0.18 micron process.

Conventional non-volatile memory cells typically require special high voltage transistors to generate the necessary high voltages (typically 8 Volts to 15 Volts) required to perform program and erase operations of the non-volatile memory cells. These high voltage transistors are not available in a conventional logic process. These high voltage transistors are described, for example, in U.S. Pat. No. 5,723,355 to Chang et al.

U.S. Pat. No. 5,761,126 to Chi et al. describes a single poly EPROM cell that utilizes band-to-band tunneling in silicon to generate channel hot-electrons to be injected into a floating gate from a control gate. A relatively thin tunnel oxide can be used in this memory cell because of the enhanced electron injection. However, this memory cell only supports programming (i.e., electron injection into the floating gate). No support is provided to remove electrons from the floating gate (i.e., an erase operation is not supported).

The use of a thin gate oxide as tunneling oxide presents a challenge for achieving acceptable data retention time for non-volatile memory cells. A thin gate oxide is defined herein as a gate oxide layer having a thickness in the range of 1.5 nm to 6.0 nm. Although programming voltages may be reduced by the use of a thin gate oxide, the thin gate oxide will exacerbate cell disturbances. That is, the thin gate oxide will significantly increase the probability of spurious charge injection or removal from the floating gate during normal program, erase and read operations. This is due to the high electric field present in or near the thin gate oxide. As conventional logic processes scale down in geometry, the gate oxide thickness scales down proportionally. For example, a 0.25 micron process uses a 5 nm gate oxide thickness, a 0.18 micron process uses a 3.5 nm gate oxide thickness, and a 0.15 micron process uses a 3 nm gate oxide thickness. As a result, data-retention becomes a serious problem when using the standard gate oxide as the tunnel oxide in a non-volatile memory cell. U.S. Pat. No. 5,511,020 to Hu et al. describes data refreshing techniques to improve data retention time using very thin tunnel oxides.

It would therefore be desirable to implement a single-poly non-volatile memory cell using a conventional logic process, without requiring process modification and/or additional process steps.

It would also be desirable to have a method of operating non-volatile memory cells in conjunction with volatile memory arrays in a manner that minimizes disturbances from write, erasing and read operations, thereby improving the data retention time for the non-volatile memory cells.

SUMMARY

Accordingly, the present invention provides a non-volatile memory cell fabricated using a conventional logic process. The non-volatile memory cell uses a thin gate oxide (i.e., 1.5 nm to 6 nm) available in a conventional logic process. The non-volatile memory cell can be programmed and erased using relatively low voltages. The voltages required to program and erase can be provided by transistors readily available in a conventional logic process (i.e., transistors having a breakdown voltages in the range of 3 Volts to 7 Volts).

In one embodiment, the non-volatile memory cell includes a p-type semiconductor substrate and an n-well located in the substrate. A PMOS transistor is fabricated in the n-well. The PMOS transistor includes the thin gate oxide and an overlying polycrystalline silicon gate. An NMOS capacitor structure is fabricated in the p-type substrate. The NMOS capacitor structure includes an n-type coupling region located in the p-type substrate. The n-type coupling region is formed by the n-type source/drain implants, thereby eliminating the need for any additional implants not normally provided by the conventional logic process. The thin gate oxide and the polycrystalline silicon gate extend over the p-type substrate and the n-type coupling region, thereby forming the NMOS capacitor structure. The NMOS capacitor structure and the PMOS transistor are sized such that the NMOS capacitor structure has a capacitance larger than a capacitance of the PMOS transistor. Advantageously, a triple-well structure is not required by the present invention.

In another embodiment of the present invention, an NVM cell is fabricated by slightly modifying a conventional logic process. In this embodiment, the NVM cell is fabricated by forming the gate electrode of an access transistor from a first conductive layer, and then forming a capacitor structure that contacts the gate electrode. In one embodiment, the capacitor structure is fabricated by forming a crown electrode of a capacitor structure from a second conductive layer, forming a dielectric layer over the crown electrode, and then forming an plate electrode over the dielectric layer from a third conductive layer. The crown electrode contacts the gate electrode, thereby providing an electrical connection between these electrodes. A first set of thermal cycles are performed during the formation of the capacitor structure. After the capacitor structure has been formed, P+ and/or N+ ion implantations are performed, thereby forming shallow junctions on the chip (e.g., a drain region of the access transistor). Salicide is subsequently formed over the resulting structure. A second set of thermal cycles are performed to activate the implanted P+ and/or N+ impurities and the salicide. In the described embodiment, the second set of thermal cycles are comparable or less than the first set of thermal cycles. Because the first set of thermal cycles are performed prior to forming the N+ and P+ shallow junctions and salicide, the N+ and P+ shallow junctions and salicide are not adversely affected by the first set of thermal cycles.

In a particular embodiment, the crown electrode has a base region with vertical walls that extend upward from the base region. A dielectric layer, such as ONO, is located over the crown electrode. The plate electrode is located over the dielectric layer, such that the plate electrode extends over at least the interior surfaces of vertical walls of the crown electrode. The plate electrode can additionally extend over the exterior surfaces of the vertical walls of the crown electrode. The configuration of the crown electrode and plate electrode advantageously results in an NVM cell having a small layout area.

The present invention incorporates a negative voltage generator that provides a negative boosted voltage having a voltage level that is less than the $V_{SS}$ supply voltage by a voltage that is less than a diode turn-on voltage (0.7 Volts). In one embodiment, the negative boosted voltage has a value of −0.5 Volts. The negative boosted voltage is applied to the control gate of the non-volatile memory cell to enhance the electron removal operation and normal read operation without requiring a triple-well underneath the control gate.

The present invention also incorporates a positive voltage generator that provides a positive boosted voltage having a voltage level that is greater than the $V_{dd}$ supply voltage by a voltage that is less than a diode turn-on voltage (0.7 Volts). In one embodiment, the positive boosted voltage has a value equal to $V_{dd}$+0.5 Volts. The positive boosted voltage is applied to the N-well of the non-volatile memory cell and the control gates of non-selected memory cells during normal read operations to suppress leakage currents through those non-selected memory cells and to improve operating margins.

In accordance with one embodiment of the present invention, non-volatile memory cells are used in a system-on-a-chip system. After power-up of a system-on-a-chip integrated circuit incorporating the embedded non-volatile memory cells, the contents of the non-volatile memory cells are read out and stored (with or without data decompression operations) into on-chip or off-chip volatile memory. The data contents of the non-volatile memory cells are then refreshed (through charge injection and removal) with optimum signal condition. The non-volatile memory cells then remain in an idle or standby mode substantially without a significant external electric field. If a reprogramming operation or a refresh operation is required, then the non-volatile memory cells are reprogrammed or refreshed as required and then returned to the idle or standby mode. As a result, the storage characteristics of the thin oxide non-volatile memory cells are improved.

The present invention will be more fully understood in view of the following description and drawings.

BRIEF DESCRIPTION OF THE DRAWINGS

FIG. 5 is a table illustrating the operating modes of the array of FIG. 4 in accordance with one embodiment of the present invention;

DETAILED DESCRIPTION

Figure 1A:
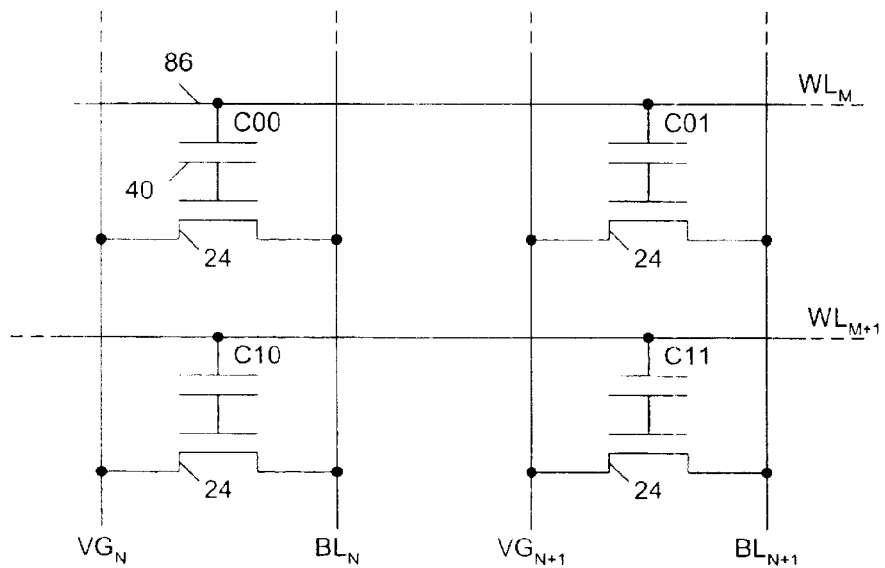
FIG. 1A is a schematic of a conventional non-volatile memory cell fabricated by a single-poly process.
Figure 1B:
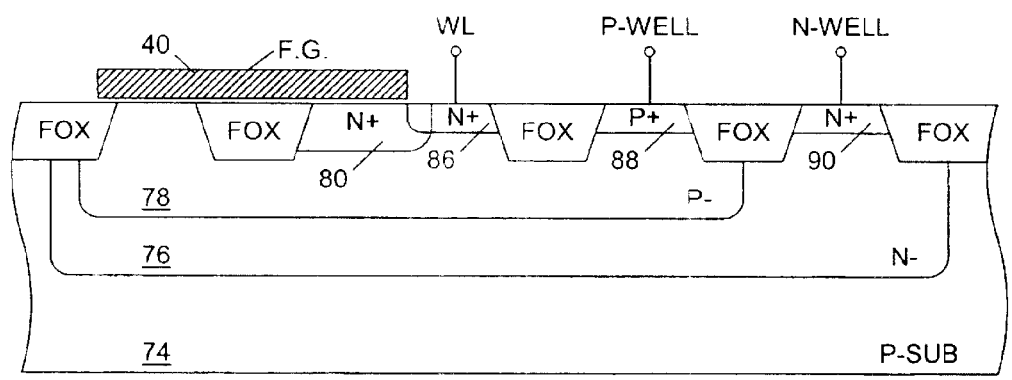
FIG. 1B is a cross-sectional view of the non-volatile memory cell of FIG. 1A.
Figure 2:
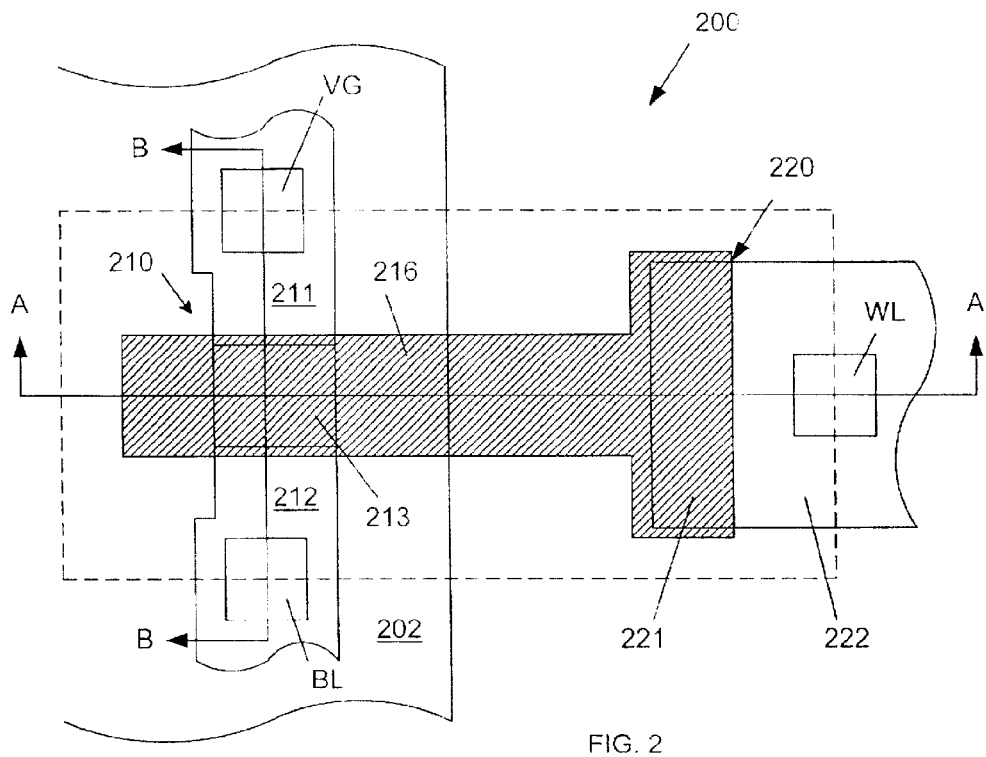
FIG. 2 is a top view of a non-volatile memory cell having a PMOS access transistor and an NMOS coupling gate in accordance with one embodiment of the present invention.
Figure 3A:
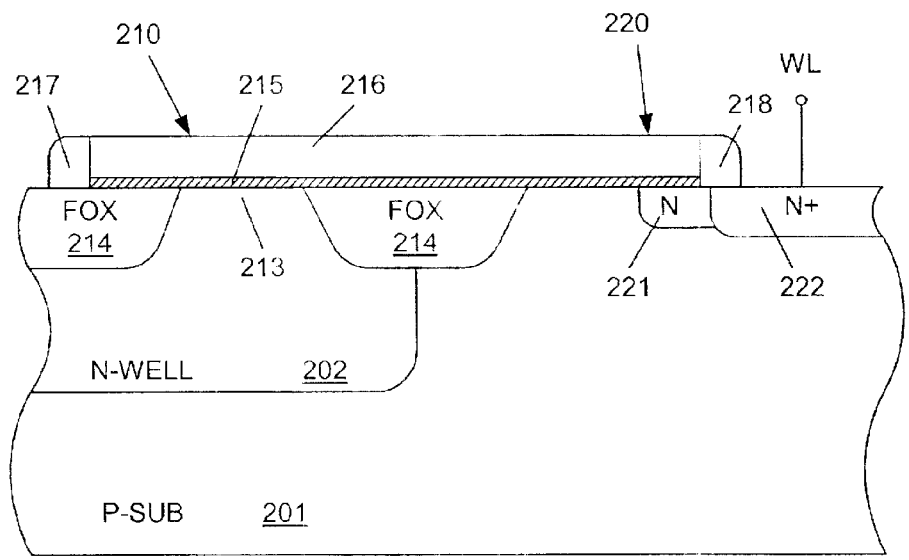
FIGS. 3A and 3B are cross-sectional views of the non-volatile memory cell of FIG. 2.
Figure 3B:
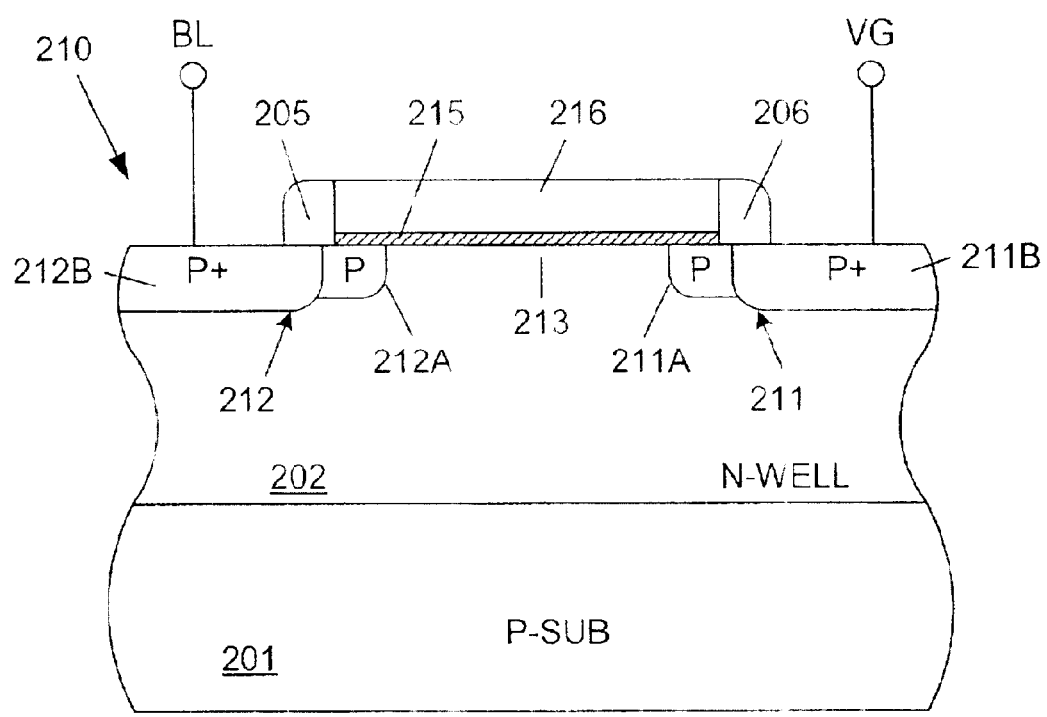

FIG. 2 is a top layout view of a non-volatile memory cell 200 in accordance with one embodiment of the present invention. FIG. 3A is a cross sectional view of the non-volatile memory cell of FIG. 2 along section line A—A. FIG. 3B is a cross sectional view of the non-volatile memory cell of FIG. 2 along section line B—B. In the described example, non-volatile memory cell 200 is fabricated using a 0.25 micron conventional logic process having a typical gate oxide thickness of about 5 nm. Non-volatile memory cell 200 is operated in response to a positive $V_{dd}$ supply voltage that has a nominal voltage of 2.5 Volts during normal operations, and a $V_{SS}$ supply voltage of 0 Volts.

Non-volatile memory cell 200 is fabricated in a p-type monocrystalline semiconductor substrate 201. In the described embodiment, substrate 201 is silicon. Non-volatile memory cell 200 includes a PMOS access transistor 210. Access transistor 210 includes p-type source region 211 and p-type drain region 212, which are formed in n-well 202. Source region 211 includes lightly doped source 211A and p+ source contact region 211B. Drain region 212 includes lightly doped drain 212A and p+ drain contact region 212B. An n-type channel region 213 is located between source region 211 and drain region 212. Channel region 213 has a width of about 0.24 microns. Source region 211 is connected to a virtual-ground (VG) line and drain region 212 is connected to a bit line (BL). Field oxide 214 is located around the source, drain and channel regions as illustrated. Field oxide 214 is planarized, such that the upper surface of field oxide 214 and the upper surface of substrate 201 are located in the same plane. A thin gate oxide layer 215, having a thickness of about 5 nm, is located over the channel region 213. Gate oxide layer 215 has the same thickness as the gate oxide layers used in the logic transistors (not shown) fabricated in substrate 201. A conductively doped polycrystalline silicon floating gate 216 is located over thin gate oxide 215. Sidewall spacers 205–206 and 217–218, which are typically formed from silicon nitride or silicon oxide, are located at the edges of floating gate 216.

Floating gate 216 and thin gate oxide 215 extend laterally beyond access transistor 210 over p-type substrate 201 and n-type coupling region 221. N-type coupling region 221 is coupled to n+ word line 222. N-type regions 221–222, gate oxide 215 and floating gate 216 form an NMOS capacitor structure 220. NMOS capacitor structure 220 couples word line 222 to floating gate 216. N-type coupling region 221 is self-aligned with the edge of floating gate 216. This self-alignment is accomplished by implanting an n-type impurity using the edge of floating gate 216 as a mask, and then diffusing the impurity under the floating gate using an anneal step. N-type coupling region 221 is formed at the same time as the source and drain regions of NMOS logic transistors (not shown). Thus, no additional step is required to form n-type coupling region 221.

Similarly, n+ word line 222 is self-aligned with the edge of sidewall spacer 218. This self-alignment is accomplished by implanting an n-type impurity using the edge of sidewall spacer 218 as a mask, and then diffusing the impurity under the sidewall spacer using an anneal step. N+ word line 222 is formed at the same time as the n+ contact regions of NMOS logic transistors (not shown). Thus, no additional step is required to form n+ word line 222.

The total coupling capacitance of NMOS capacitor structure 220 is preferably significantly larger than the gate capacitance of the PMOS access transistor 210. In one embodiment, the coupling capacitance of NMOS capacitor structure 220 is about four times larger than the gate capacitance of PMOS access transistor 210. Non-volatile memory cell 200 can be fabricated using a conventional logic process, without any process modifications or special implants.

Figure 4:
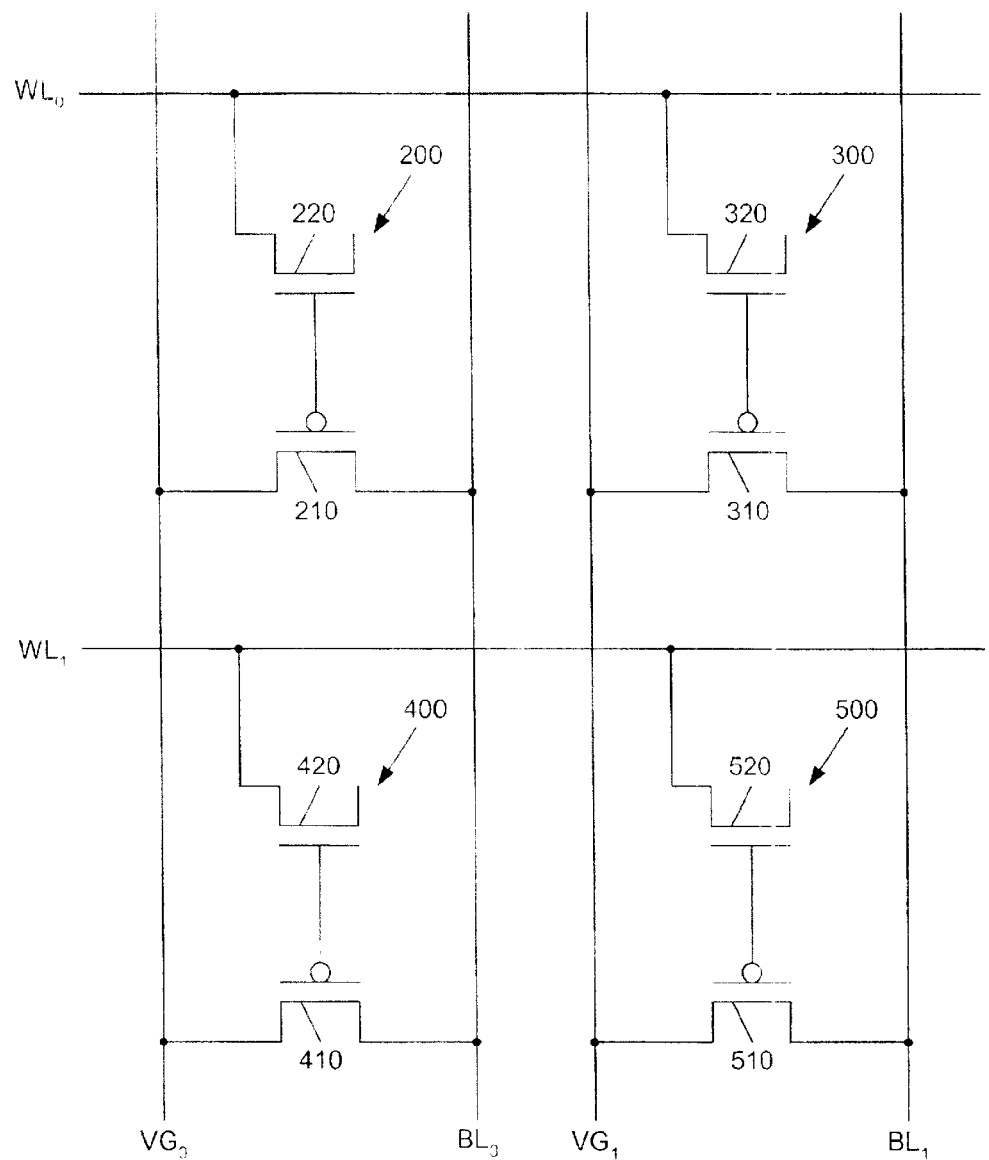
FIG. 4 is a schematic diagram of an array of the non-volatile memory cells of FIG. 2.

FIG. 4 is a schematic diagram of a 2×2 array of non-volatile memory cells 200, 300, 400 and 500. Non-volatile memory cells 300, 400 and 500 are identical to above-described non-volatile memory cell 200. Thus, non-volatile memory cells 300, 400 and 500 include PMOS access transistors 310, 410 and 510, respectively, and NMOS capacitor structures 320, 420 and 520, respectively. The sources of PMOS access transistors 210 and 410 are commonly connected to a first virtual ground line $VG_0$. Similarly, the sources of access transistors 310 and 510 are commonly connected to a second virtual ground line $VG_1$. The drains of PMOS access transistors 210 and 410 are commonly connected to a first bit line $BL_0$. Similarly, the drains of PMOS access transistors 310 and 510 are commonly connected to a second bit line $BL_1$. NNOS capacitor structures 220 and 320 are commonly connected to a first word line $WL_0$. Similarly, NMOS capacitor structures 420 and 520 are commonly connected to a second word line $WL_1$. Although the described array has two rows and two columns, it is understood that arrays having other sizes can be implemented by one of ordinary skill in the art.

FIG. 5 is a table that defines the operation of the array of FIG. 4 in accordance with one embodiment of the present invention.

The programming mode is described in connection with the programming of non-volatile memory cell 200. In the programming mode, electrons are selectively removed from the floating gate of the cell to be programmed. As a result, the PMOS threshold voltage ($V_{tp}$) of the programmed cell is more negative and therefore turned off during normal read operations. The programming mode is implemented by a direct tunneling (i.e., Fowler-Nordheim tunneling) mechanism through the gate oxide of the PMOS access transistor.

Non-volatile memory cell 200 is programmed as follows. Word line $WL_0$ is held at a voltage of 0 Volts, while bit line $BL_0$ and virtual ground line $VG_0$ are each held at a voltage of 6.5 Volts. In another embodiment, either bit line $BL_0$ or virtual ground line $VG_0$ is held at a voltage of 6.5 Volts, while the other line is left floating. N-well 202 is held at a voltage of 6.5 Volts, and p-type substrate 201 is held at a voltage of 0 Volts, thereby preventing the n-well/p-substrate junction from being forward biased. Under these bias conditions, an inversion layer is formed in the channel region of NMOS capacitor structure 220, and the floating gate 216 is coupled to a voltage slightly greater than 0 Volts. As a result, a high voltage drop exists across the gate oxide 215 of PMOS access transistor 210. An inversion layer is therefore formed in channel region 213 of PMOS access transistor 210, with the electric field exceeding 10 MV/cm. Under these conditions, electrons in floating gate 216 tunnel out to the high voltage PMOS inversion layer.

In the present example, non-volatile memory cell 300 is selected by the 0 Volt signal applied to word line $WL_0$. However, it is not desired to program non-volatile memory cell 300. To prevent electron removal from the floating gate of non-volatile memory cell 300, bit line $BL_1$ and virtual ground line $VG_1$ are each held at a voltage of 3.0 Volts. In another embodiment, either bit line $BL_1$ or virtual ground line $VG_1$ is held at a voltage of 3.0 Volts, and the other line is left floating. Under these conditions, the voltage drop across the gate oxide of PMOS access transistor 310 is substantially less than the voltage required for direct tunneling.

In the present programming example, a voltage of 3.0 Volts is applied to word line $WL_1$. As a result, non-volatile memory cells 400 and 500 are not selected for programming. Given the above-describe voltages on bit lines $BL_0$–$BL_1$ and virtual ground lines $VG_0$–$VG_1$, the 3.0 Volt signal applied to word line $WL_1$ ensures that the voltages across the gate oxide layers of PMOS access transistors 410 and 510 are substantially below the voltage required for direct tunneling. More specifically, because bit lines $BL_0$–$BL_1$ and virtual ground lines $VG_0$–$VG_1$ will be at either 6.5 Volts, 3.0 Volts or floating, the maximum disturb voltage will be 6.5 Volts minus 3.0 Volts, or 3.5 Volts. This maximum disturb voltage is therefore much less than the program voltage of 6.5 Volts.

In the described embodiment, the 3.0 Volt signal is generated by a positive voltage generator. This positive voltage generator provides the 3.0 Volt signal, which is greater than the 2.5 Volt positive supply voltage by 0.5 Volts. The 3.0 Volt signal is therefore greater than the 2.5 Volt signal by a magnitude less than a diode voltage drop of 0.7 Volts. A positive voltage generator capable of generating a positive boosted voltage which is greater than the positive supply voltage by a magnitude less than a diode voltage drop is described in U.S. Pat. No. 6,147,914, which is hereby incorporated by reference. This positive voltage generator is fabricated using elements that are compatible with a conventional logic process. Use of the 3.0 Volt signal advantageously improves the operating margin of memory cells 200, 300, 400 and 500.

In the erase mode, electrons are injected into the floating gates of memory cells 200, 300, 400 and 500, thereby making the threshold voltage (Vtp) of PMOS access transistors 210, 310, 410 and 510 more positive. As a result of the more positive threshold voltages, the erased PMOS access transistors are turned on during normal read operations. The erase operation implements band-to-band tunneling channel hot-electron (CHE) injection into the floating gates through Fowler-Nordheim tunneling mechanism of the PMOS access transistors. The erase operation is preferably performed in a sector mode, in which all memory cells sharing word lines and bit lines are erased together.

In the erase mode, word lines $WL_0$ and $WL_1$ are held at 0 Volts, and bit lines $BL_0$–$BL_1$ and virtual ground lines $VG_0$–$VG_1$ are held at –6.5 Volts. In another embodiment, either bit lines $BL_0$–$BL_1$ or virtual ground lines $VG_0$–$VG_1$ are held at –6.5 Volts, and the other lines are left floating. P-type substrate 201 and N-well 202 are both held at 0 Volts.

Under these bias conditions, the floating gates of memory cells 200, 300, 400 and 500 arecoupled to a voltage slightly less than 0 Volts. As a result, NMOS capacitor structures 220, 320, 420 and 520 and PMOS access transistors 210, 310, 410 and 510 are placed in an accumulation mode. A relatively high voltage drop exists across the p-type source/drain regions of the PMOS access transistors and the n-well 202. A relatively high voltage drop also exists between the floating gates and the p-type source/drain regions of the PMOS access transistors. The high electrical field conditions cause band-to-band tunneling to occur near the edges of the p-type source/drain regions, and the resulting channel hot-electrons (CHE) are accelerated and injected into the floating gates.

To read non-volatile memory cells 200 and 300, word line $WL_0$ is held at 0 Volts, virtual ground lines $VG_0$–$VG_1$ are held at 2.5 Volts (or some lower voltage level to suppress leakage current), n-well 202 is held at 3.0 Volts, and p-type substrate 201 is held at 0 Volts. Bit lines $BL_0$–$BL_1$ are pre-charged to 0 Volts (or some other voltage lower than virtual ground lines $VG_0$–$VG_1$). Under these conditions, read current will flow through the access transistors of non-programmed (erased) cells, while read current will be less through the access transistors of programmed cells.

The word line $WL_1$ associated with the non-selected cells is held at 3.0 Volts in the normal read mode, thereby turning off access transistors 410 and 510. Turning off access transistors 410 and 510 prevents current from flowing through these transistors into bit lines $BL_0$ and $BL_1$. As a result, cells 400 and 500 do not interfere with the bit line signals from the selected cells 200 and 300.

During the read operation, n-well 201 is biased at a voltage that is 0.5 Volts greater than the virtual ground lines $VG_0$–$VG_1$. This n-well biasing is referred to as "n-well back bias". In a conventional logic process having a minimum feature size of 0.24 microns, the typical threshold voltage of a p-channel transistor (Vtp) is equal to –0.5 Volts. The n-well back bias raises the magnitude of the p-channel threshold voltage (to a voltage that is more negative). As a result, the sub-threshold leakage current is reduced in non-selected cells (e.g., cells 400 and 500) and selected cells that are programmed to be "off" (i.e., non-conductive during a read operation).

Similarly, the non-selected word line $WL_1$ is biased at 3.0 Volts, which is 0.5 Volts greater than the virtual ground lines $VG_0$–$VG_1$. This "gate reverse-bias" is also important to further reduce the sub-threshold leakage currents in the non-selected cells.

In an alternate embodiment of the present invention, the bias condition of a cell being programmed (e.g., cell 200 in the above-described example) can be modified to have a word line voltage of –0.5 Volts (instead of 0 Volts). This reduced word line voltage prevents turn on of the junction between word line 222 and p-type substrate 201. The –0.5 Volt word line bias, which is smaller in magnitude than a diode turn-on voltage, increases the maximum voltage across the gate oxide layer 215 without requiring higher voltage transistors to be used in negative voltage generator. The negative voltage generator used to generate a word line bias voltage of –0.5 Volts is described in U.S. Pat. No. 6,147,914.

In this embodiment, the bias condition of a cell that is not being programmed, but is in the same row as a cell being programmed (e.g., cell 300 in the above-described example) will also have a word line voltage of –0.5 Volts. To compensate for this lower word line voltage, the bit line and virtual ground line of the non-selected cell are reduced by 0.5 Volts, from 3.0 Volts to 2.5 Volts.

In this embodiment, the word lines of rows that do not have any cells being programmed are coupled to receive a word line bias voltage of 2.5 Volts. The associated bit lines and virtual ground lines are biased at either 2.5 Volts or 6.5 Volts, depending on whether the cells are in the same column as a cell being programmed. Note that the biasing of n-well 202 and p-type substrate 201 remain at 6.5 Volts and 0 Volts, respectively, in this embodiment.

For a conventional logic process having a minimum line size at or below 0.24 microns, the use of very thin gate oxides as tunneling oxide present major challenges for achieving acceptable data retention time for non-volatile memory cells. Although programming voltages may be reduced, the disturbance problem (i.e., spurious injection or removal of charges from the floating gate) during normal program, erase and read operations increases significantly due to the high electric field present in or near the thin tunnel oxide and the resultant tunneling leakage current and channel hot-electron injection leakage currents. As conventional logic processes scale down in geometry, the standard gate oxides also get scaled down proportionally (e.g., 5 nm and 7 nm for a 0.25 micron process, 3.5 nm, 5 nm and 7 nm for a 0.18 micron process, and 3 nm, 5 nm and 7 nm for a 0.15 micron process). As a result, data-retention becomes a serious problem when using the standard gate oxide as the tunnel oxide for the non-volatile memory cell. U.S. Pat. No. 5,511,020, which is hereby incorporated by reference in its entirety, describes data refreshing techniques to improve data retention time of non-volatile memory cells using very thin tunnel oxides. The data refreshing techniques of U.S. Pat. No. 5,511,020 can be applied, as necessary, to the non-volatile memory cells of the present invention. Note that such data refreshing techniques are optional, and are not required in order to practice the present invention.

Since both the tunneling current and the channel hot-electron injection current are highly dependent on the level of electric field present in or near the non-volatile memory cells, a method for operating non-volatile memory cells to minimize the frequency and duration of high electric field operations is described in a preferred embodiment of the present invention, thereby maximizing data retention time for non-volatile memory cells using very thin tunneling oxides.

Figure 6:
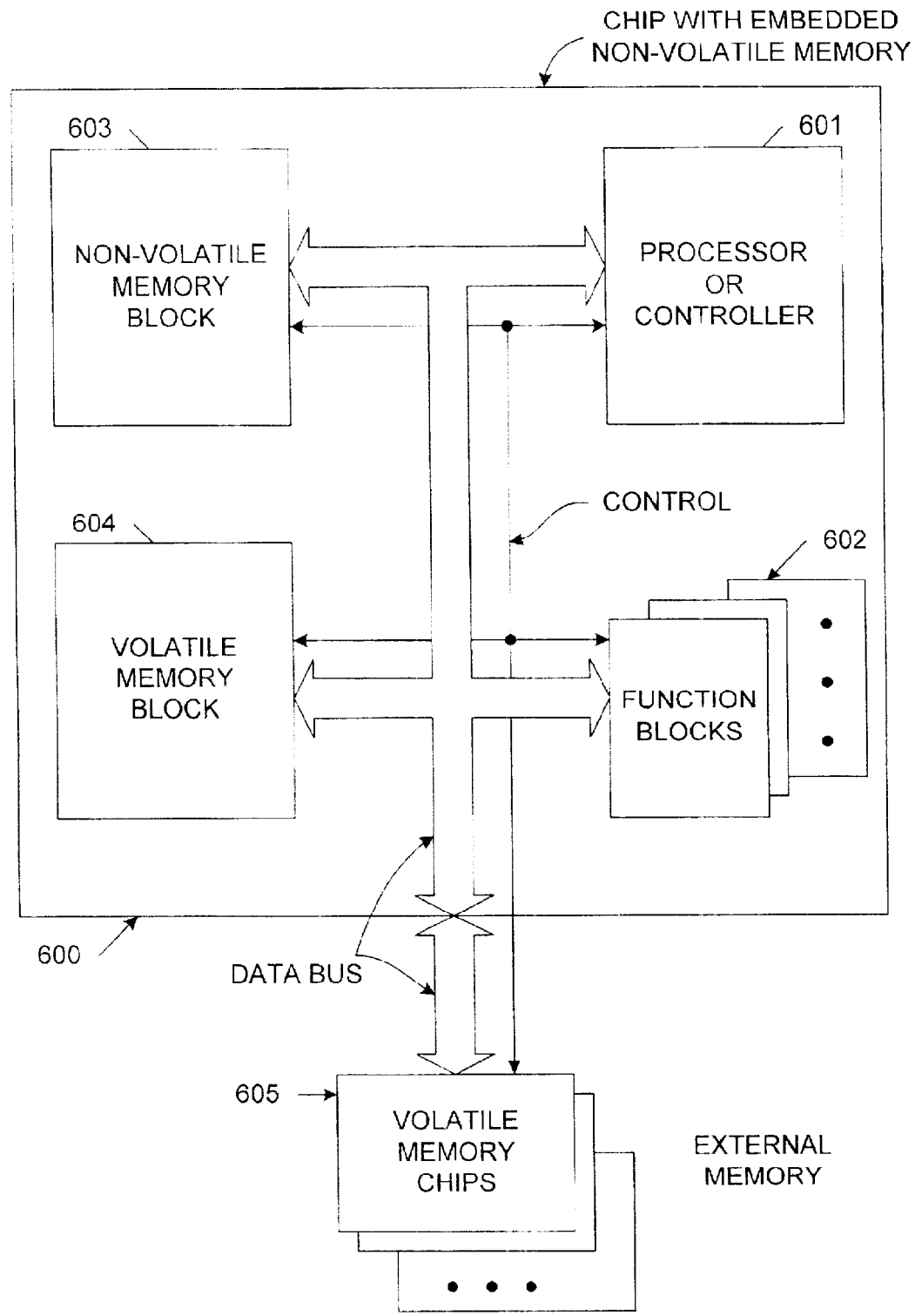
FIG. 6 is a block diagram illustrating a system-on-a-chip in accordance with one embodiment of the present invention.

FIG. 6 is a block diagram of a system-on-a-chip integrated circuit 600 in accordance with one embodiment of the present invention. Integrated circuit chip 600 includes processor or controller unit 601, various functional blocks 602, non-volatile memory block 603 and on-chip volatile memory block 604. In another embodiment, on-chip volatile memory block 604 can be replaced with off-chip volatile memory chips 605. In one embodiment, functional blocks 602 include at least one programmable logic block that uses volatile memory elements as control and configuration bits. At least a portion of these control and configuration bits are stored in non-volatile memory block 603. During initialization, these control and configuration bits are loaded into volatile memory block 604, thereby enabling normal operations within functional blocks 602. To reduce the disturbances originated from the program, erase and read modes, the non-volatile memory cells in on-chip non-volatile memory block 603 are operated in accordance with the flow chart 700 provided in FIG. 7.

Figure 7:
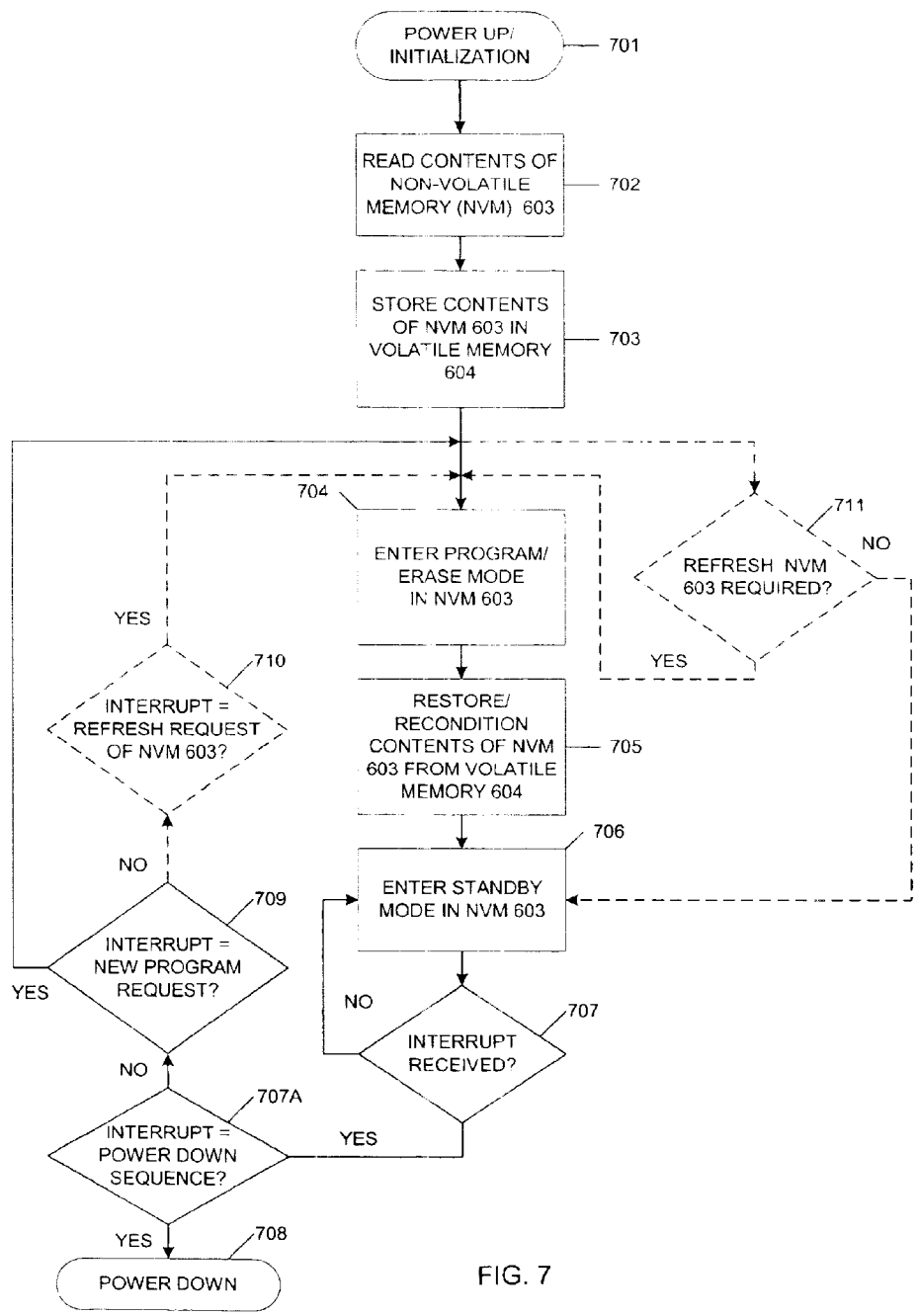
FIG. 7 is a flow diagram illustrating the operation of the system-on-a-chip of FIG. 6 in accordance with one embodiment of the present invention.

As illustrated in FIG. 7, the system-on-a-chip integrated circuit 600 is powered-up and/or initialized during Step 701. The contents of non-volatile memory array 603 are then read during Step 702. In one embodiment, the read operation performed during Step 702 includes adaptive algorithms that sample the data content of a selected cell or cells in non-volatile memory array 603 to determine the actual threshold voltage levels for the programmed and non-programmed non-volatile memory cells. The optimum voltages for reading out the contents of the non-volatile memory cells are then selected in view of the actual threshold voltage levels. For example, if the actual threshold voltage levels are relatively low, then a lower read voltage is used. The data content stored in non-volatile memory array 603 may be compressed to reduce the capacity requirement of the non-volatile memory array 603 on chip 600. Data integrity may be further enhanced by utilizing error detection and correction (EDC) techniques during the read operation.

During Step 703, the contents read from non-volatile memory block 603 are stored in volatile memory block 604 (or optionally in off-chip volatile memory chips 605). The non-volatile memory block 603 is then controlled to enter the program and erase modes (Step 704). Program and erase operations are then performed to non-volatile memory block 603, such that the original contents of non-volatile memory block 603 are restored/reconditioned from volatile memory block 604 (or volatile memory chips 605) (Step 705). Non-volatile memory block 603 then enters the standby mode (Step 706). During the standby mode, minimal or no external biases are applied to the non-volatile memory cells in non-volatile memory block 603. Preferably, the entire non-volatile memory block 603 is powered down to 0 Volts to prevent power supply glitches or abrupt power outages from causing disturbances to the non-volatile memory cells.

As long as no interrupt is received, non-volatile memory block 603 remains in the standby mode (Steps 706 and 707). However, if an interrupt is received, then this interrupt is processed. If the interrupt indicates a power down sequence (as determined in Step 707A), then the chip 600 is powered down Step 708). If the interrupt indicates a new program request (as determined in Step 709), then processing returns to Step 704.

As described above, refresh operations may be required in view of the thin gate oxide used in the non-volatile memory cells. Refresh of the non-volatile memory cells may be required a few times a day, once every few days or once every few weeks, depending on the particular characteristics of the cells in non-volatile memory block 603. A refresh management system, such as the one described in U.S. Pat. No. 5,511,020, is used to control the refresh operations.

The Restore/Recondition operation of Steps 704–705 can be conditional based on whether a present criterion for charge loss is met. In this case, optional Steps 710 and 711 are added as illustrated. Step 711 is added between Steps 703 and 704. In Step 711, it is determined whether a refresh operation is required in non-volatile memory block 603. If no refresh is required, then Steps 704 and 705 are bypassed (i.e., non-volatile memory block 603 is not refreshed), and processing proceeds to the standby mode in Step 706. If a refresh operation is required in Step 711, the processing proceeds to Steps 704–705, where a refresh operation is performed.

Step 710 is an additional interrupt that indicates that non-volatile memory 603 must be refreshed. This interrupt is processed by returning processing from Step 710 to Step 704, thereby refreshing non-volatile memory 603. Because Steps 710 and 711 are optional steps, these steps are shown in dashed lines in FIG. 7.

Using the above-described steps, the disturbances from program, erase and read modes can be precisely managed and predicted to achieve maximum data-retention time and data integrity in non-volatile memory block 603.

Even in the standby mode or during storage conditions (i.e., when zero or no (floating) electrical biases are applied to the non-volatile memory cells) there are internal electric fields present in the non-volatile memory cells that can cause charge loss and data retention problems. To optimize data retention time during these conditions, the internal electric fields must be minimized as well. This is accomplished in the present invention by setting the threshold voltages (Vtp) for both the programmed and erased charge states to be balanced against the internal potential levels of the silicon substrate 201 and polysilicon gate electrodes, taking into consideration the flat-band voltage levels for both the NMOS capacitor structure and the PMOS access transistor in the non-volatile memory cell. In one embodiment of the present invention, the threshold voltages of the PMOS access transistors are set equal to −0.5 Volts when the non-volatile memory cell is erased, and −1.0 Volt when the non-volatile memory cell is programmed. The difference between these threshold voltages is 0.5 Volts. Similarly, the threshold voltages of the NMOS capacitor structures are set to be equal to 0.5 Volts when the non-volatile memory cell is erased, and 0 Volts when the non-volatile memory cell is programmed. Again, the difference between these threshold voltages is 0.5 Volts.

Figure 8:
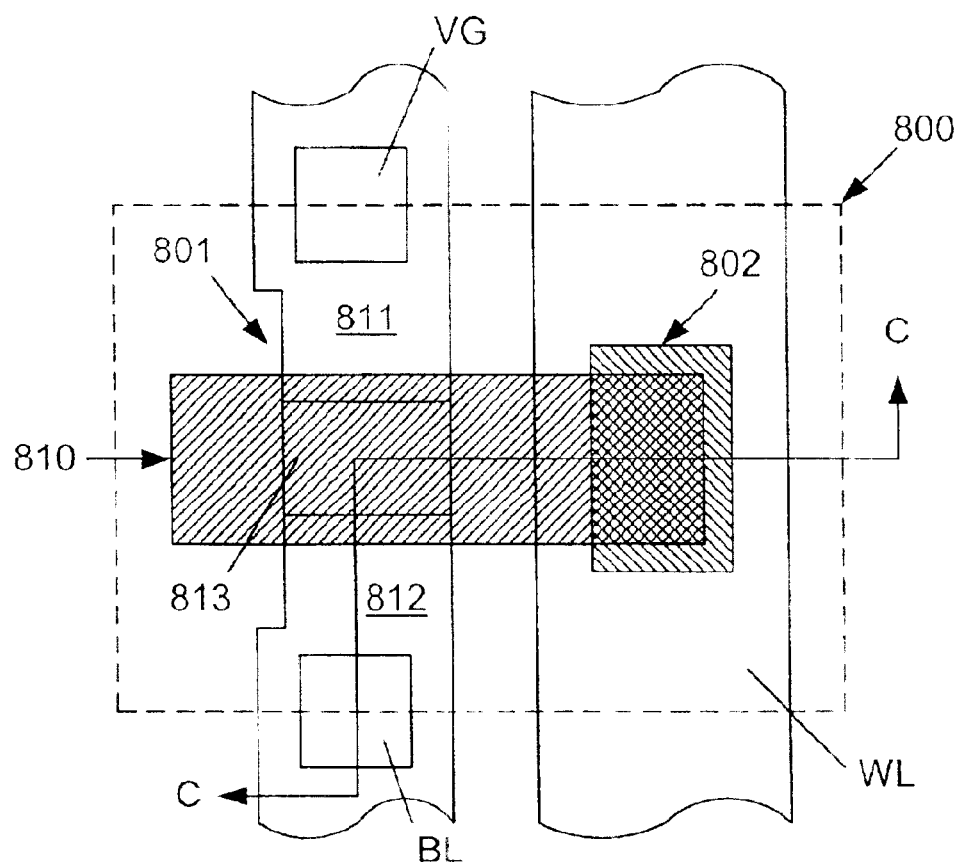
FIG. 8 is a top view of a non-volatile memory cell having a PMOS access transistor and an crown/plate capacitor structure in accordance with another embodiment of the present invention.

FIG. 8 is a top view of a non-volatile memory cell 800 in accordance with another embodiment of the present invention. FIGS. 9A–9J are cross sectional views of NVM cell 800 along section line C—C during various stages of fabrication. In general, NVM cell 800 includes a PMOS access transistor 801 and a capacitor structure 802 having a crown and plate configuration, which is formed using two additional polysilicon layers. These additional polysilicon layers are formed prior to the formation of N+ and P+ shallow junctions and prior to the formation of salicide. The crown/plate capacitor structure 802 replaces the NMOS capacitor structure located outside n-well 202 in NVM cell 200 (FIG. 2). Using two additional polysilicon layers enables the formation of a smaller capacitor structure and therefore a smaller NVM cell.

Access transistor 801 includes salicide gate electrode 810, p-type source region 811 and p-type drain region 812. An n-type channel region 813 is located between source region 811 and drain region 812. Channel region 813 has a width of about 0.24 microns. Source region 811 is connected to the virtual-ground (VG) line, drain region 812 is connected to the bit line (BL), and crown/plate capacitor structure 802 is connected to a metal word line (WL).

Figure 9A:
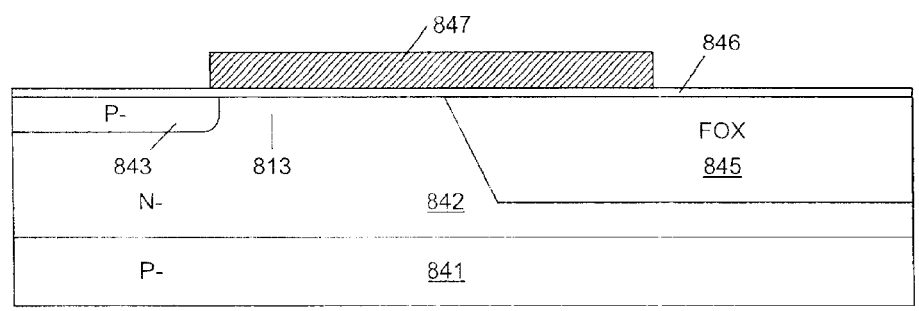
FIGS. 9A–9J are cross sectional views of an NVM cell of FIG. 8 during various stages of fabrication.

As illustrated in FIG. 9A, an n-type well region 842 is formed in a p-type monocrystalline silicon substrate 841. In the described example, substrate 841 has a <1,0,0> crystalline orientation and a dopant concentration of about $1 \times 10^{16}/cm^3$. N-well 842, which is formed by conventional process steps such as ion implantation, has a dopant concentration of about $1 \times 10^{17}/cm^3$. Other crystal orientations and concentrations can be used in other embodiments of the invention. In addition, the conductivity types of the various regions can be reversed in other embodiments with similar results.

In the described embodiment, field oxide 845 is formed using shallow trench isolation (STI) techniques. In STI techniques, trenches are etched in silicon substrate 841, and these trenches are then filled with silicon oxide. The upper surface of the resulting structure is then planarized by chemical-mechanical polishing (CMP), such that the upper surface of field oxide 845 is substantially co-planar with the upper surface of n-well 842.

Gate oxide 846 is then thermally grown over the upper surface of the resulting structure. In the described embodiment, gate oxide 846 is silicon oxide having a thickness in the range of about 1.5 to 6.0 nm. However, this thickness can vary depending on the process being used.

A layer of polycrystalline silicon is deposited over the resulting structure. This polysilicon layer is then patterned to form polysilicon gate electrode 847. A P-implant mask (not shown) is then formed, and Boron diflouride ($BF_2$) is implanted at a dosage of about $1 \times 10^{14}/cm^2$ and an implant energy of about 15 KeV. Note that the Boron implantation is self-aligned with the edge of polysilicon gate electrode 847.

Figure 9B:
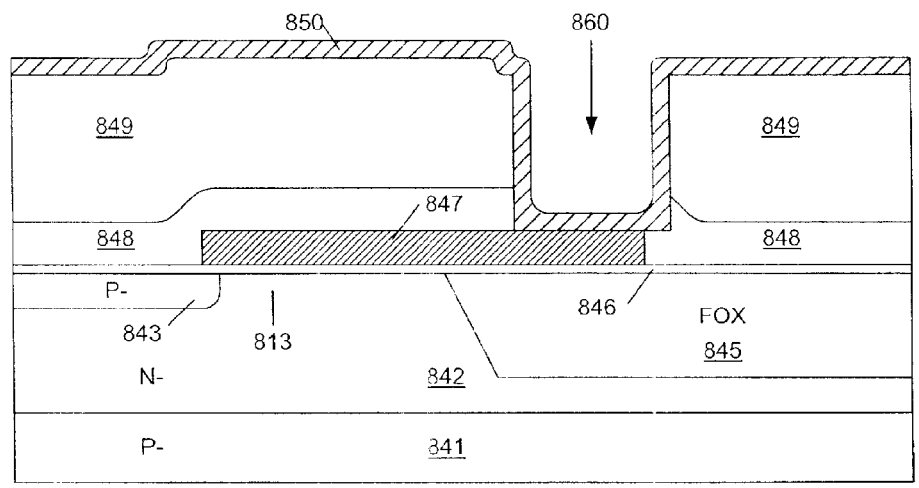

As illustrated in FIG. 9B, a layer of silicon nitride 848 is then deposited over the resulting structure. In the described embodiment, silicon nitride 848 is deposited to a thickness of about 150 nm using conventional processing techniques. In a particular embodiment, a thin layer (~20 nm) of oxide is provided under silicon nitride layer 848 to reduce stress. A thick layer of silicon oxide 849 is then deposited over silicon nitride layer 848. In the described embodiment, silicon oxide layer 849 has a thickness of about 1200 nm and is formed using conventional processing techniques.

An opening 860 is formed through silicon oxide layer 849 and silicon nitride layer 848. In the described embodiment, opening 860 has a square shape, with the square having sides about 250 nm long. In other embodiments, opening 860 can have other shapes and sizes (e.g., rectangular, cylindrical). Opening 860 is positioned to expose a portion of polysilicon gate electrode 847.

Opening 860 is created by forming a photoresist mask (not shown) over silicon oxide layer 849, and etching through an opening in the photoresist mask that defines the location and shape of opening 860.

The photoresist mask is stripped, and conductively doped polysilicon layer 850 is formed over the resulting structure. In the described embodiment, polysilicon layer 850 is formed by depositing a layer of polysilicon to a thickness of about 50 nm. Polysilicon layer 850 is then conductively doped by ion implanting a p-type impurity, such as boron diflouride ($BF_2$), into the polysilicon. Alternatively, polysilicon layer 850 can be doped in situ during deposition. Polysilicon layer 850 extends into opening 860 and contacts polysilicon gate electrode 847 as illustrated.

Figure 9C:
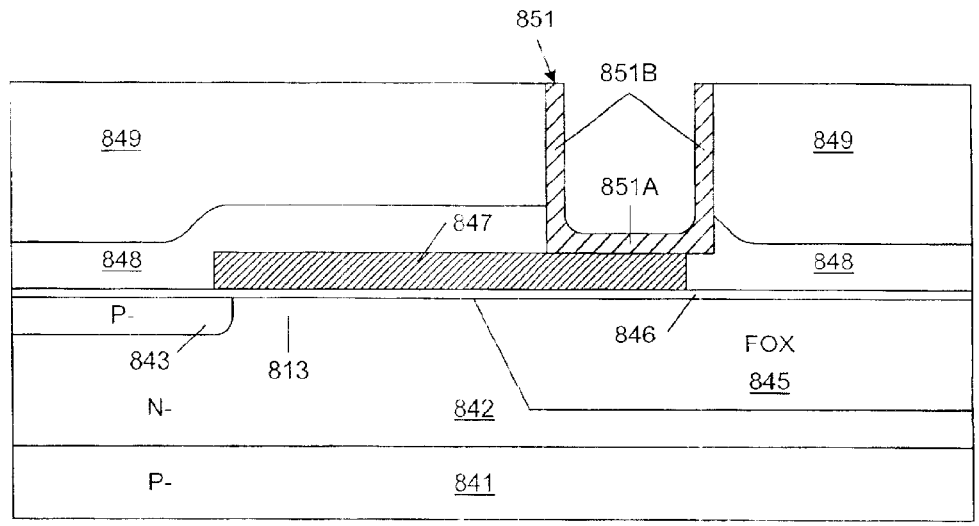

As illustrated in FIG. 9C, the upper surface of the resulting structure is planarized. In the described embodiment, a conventional chemical-mechanical polishing (CMP) process is used to perform this planarization step. In general, the planarization step removes the portion of polysilicon layer 850 that is not deposited in opening 860, as well as an upper portion of silicon oxide layer 849. After the planarization step has been performed, a polysilicon crown 851 remains in opening 860. Polysilicon crown 851 includes a substantially planar base region 851A that contacts polysilicon gate electrode 847. Polysilicon crown 851 also includes vertical walls 851B that extend vertically upward from base region 851A.

Figure 9D:
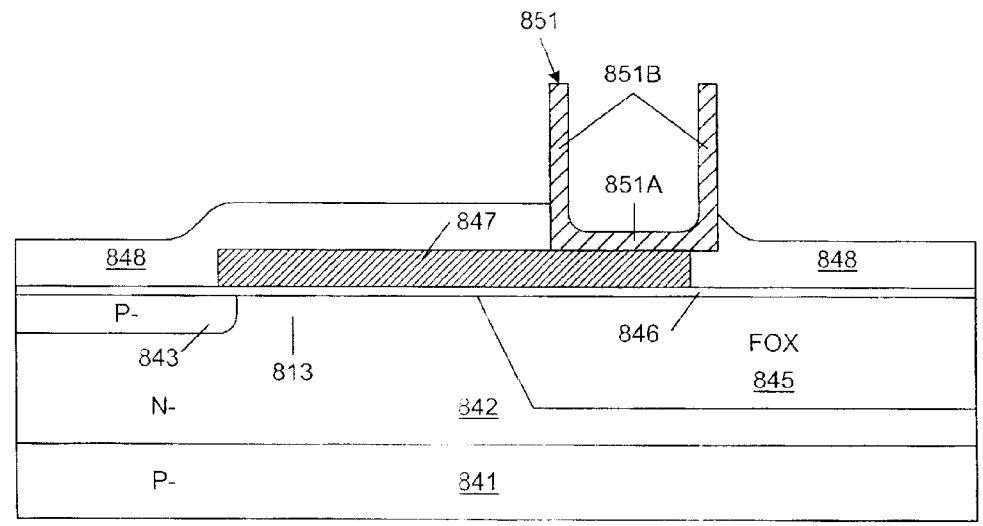

As illustrated in FIG. 9D, oxide layer 849 is then removed using an etchant that removes silicon oxide much faster than silicon nitride. This etch step is timed, such that the etchant removes silicon oxide layer 849 without significantly removing silicon nitride layer 848. In the described embodiment, this etchant is buffered or unbuffered hydrofluoric acid. After silicon oxide layer 849 has been removed, polysilicon crown 851 remains, with vertical walls 851B rising above silicon nitride layer 848. In the described embodiment, the walls 851B of polysilicon crown 851 extend about 800 nm above silicon nitride layer 848.

Figure 9E:
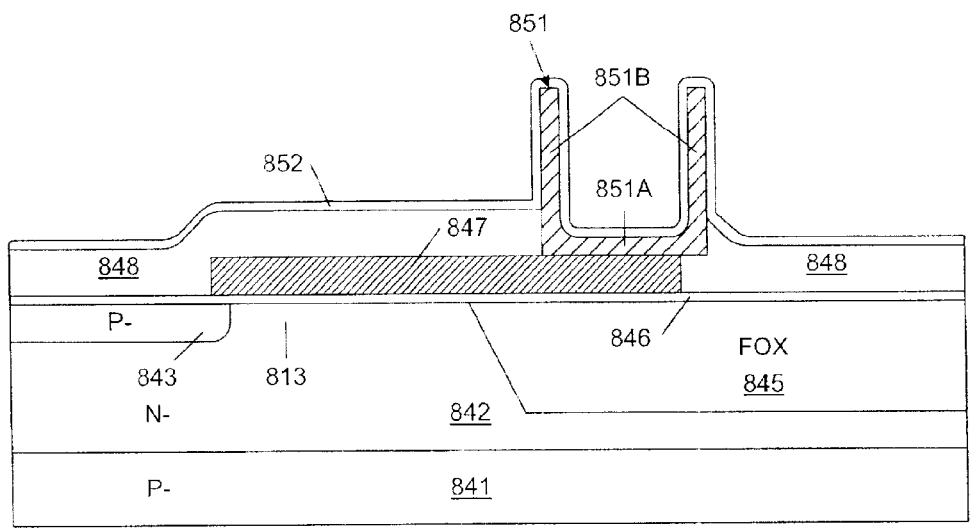

As illustrated in FIG. 9E, an oxide-nitride-oxide (ONO) structure 852 is formed over polysilicon crown 851. This ONO structure 852 is formed by depositing a first silicon oxide layer, a silicon nitride layer, and then a second silicon oxide layer. In the described embodiment, the first silicon oxide layer has a thickness of about 2 nm, the silicon nitride layer has a thickness of about 7 nm, and the second silicon oxide layer has a thickness of about 2 nm. These layers are deposited using well known processing techniques. Relatively high thermal cycles are required to form the various layers of ONO structure 852. For example, a total thermal cycle in the range of 850–950° C. for 20–60 minutes is required to form ONO structure 852. As understood by one of ordinary skill in the art, thermal cycles are a function of both temperature and time.

Figure 9F:
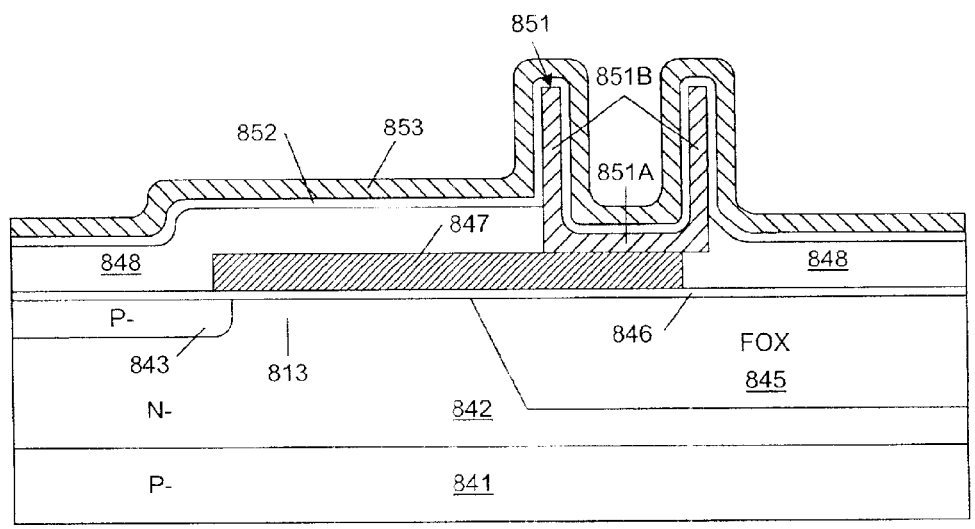

As illustrated in FIG. 9F, a conductively doped layer of polysilicon 853 is formed over ONO structure 852. In the described embodiment, polysilicon layer 853 is deposited to a thickness of about 150 nm. Polysilicon layer 853 is then conductively doped by ion implanting a p-type impurity, such as boron, into the polysilicon. Alternatively, polysilicon layer 853 can be doped in situ during deposition.

Figure 9G:
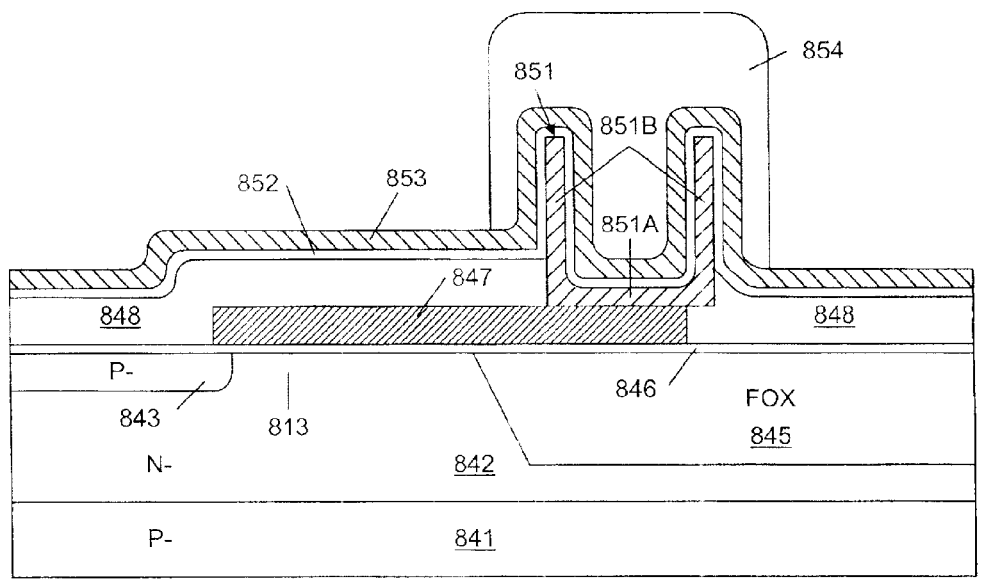
Figure 9H:
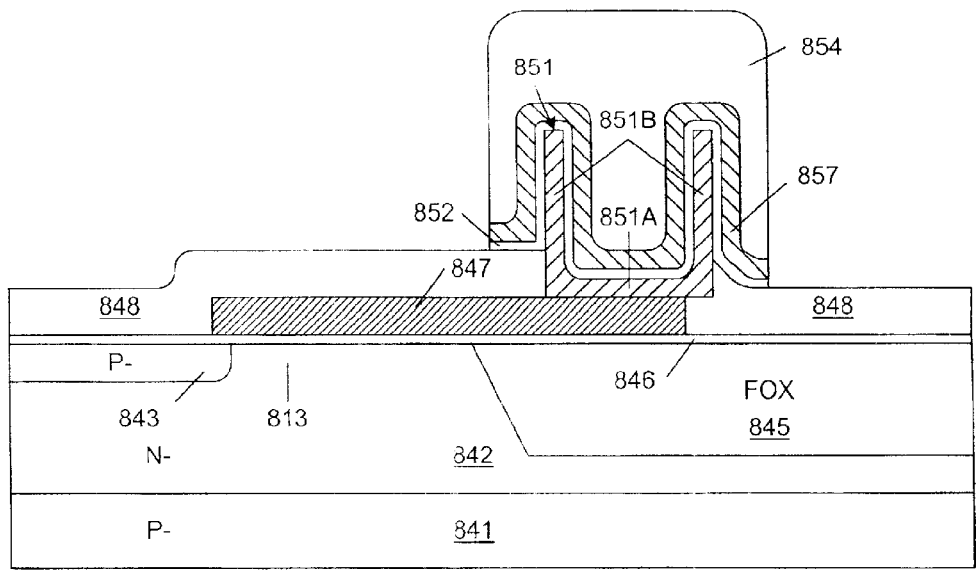

Turning now to FIG. 9G, a photoresist mask 854 is formed over polysilicon layer 853 as illustrated. Photoresist mask 854 is located over polysilicon crown 851 and the immediately adjacent area. As illustrated in FIG. 9H, a series of etches are performed to remove the exposed portions of polysilicon layer 853 and ONO layer 852. The remaining portion of polysilicon layer 853 forms a polysilicon plate structure 857.

Photoresist mask 854 is then removed, and a thermal cycle is performed to anneal polysilicon crown 851 and polysilicon plate structure 857. During this step, the thermal cycle typically uses rapid thermal annealing (RTA) at relatively high temperatures of 950–1050° C. for 30 to 90 seconds. By performing these high thermal cycles prior to the formation of P+ and N+ shallow junctions and prior to the formation of salicide structures, these high thermal cycles advantageously do not significantly affect these subsequently performed processes.

Figure 9I:
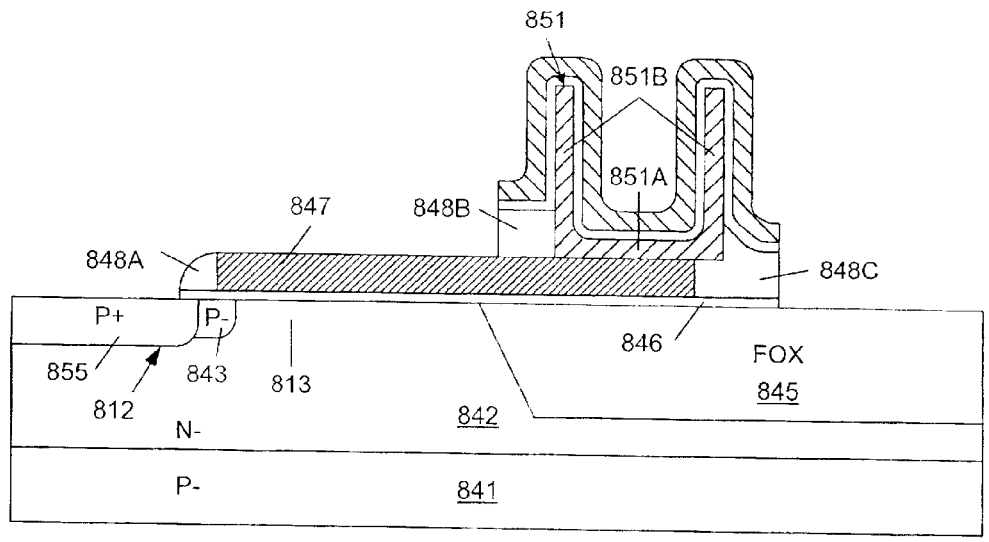

As illustrated in FIG. 9I, an anisotropic etch is performed on silicon nitride layer 848 using conventional processing techniques. After the anisotropic etch is complete, silicon nitride regions 848A–848C remain. Silicon nitride region 848A forms a sidewall spacer at one edge of polysilicon gate 847. Silicon nitride regions 848B–848C are located on either side of polysilicon crown electrode 851. Silicon nitride region 848C joins with silicon nitride region 848B outside the plane of FIG. 9I, thereby laterally surrounding polysilicon crown 851.

After silicon nitride regions 848A–848C have been formed, a P+ photoresist mask (not shown) is formed to define the locations of the desired P+ regions on the chip. A P+ type ion implant is then performed, thereby forming shallow P+ drain region 855 (as well as the other desired P+ regions on the substrate). Note that P+ drain region 855 is aligned with the edge of sidewall spacer 848A. In the described embodiment, the P+ ion implant is performed at a dosage of $5 \times 10^{15}/cm^2$ and an energy of less than 15 KeV. A short annealing thermal cycle is typically performed using RTA at 850 to 950° C. for 10 to 15 seconds. P+ drain region 855 and lightly doped drain region 843 combine to form drain region 812 (FIG. 8). Note that source region 811 is formed in parallel with drain region 812.

Figure 9J:
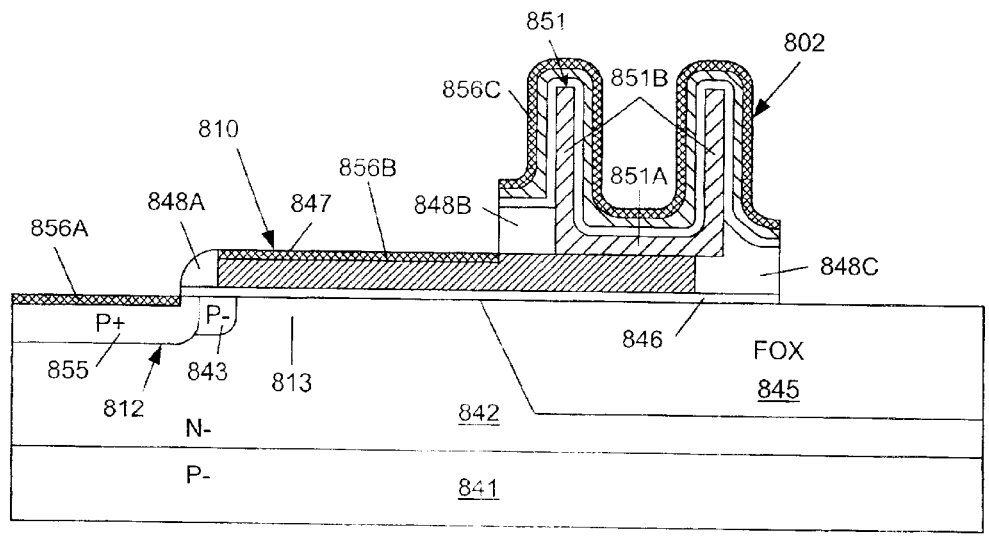

Turning now to FIG. 9J, a layer of refractory metal, such as titanium or cobalt, is blanket deposited over the resulting structure. In the described embodiment, titanium is deposited to a thickness of about 30 nm. An anneal step is then performed to form the titanium silicide at locations where the titanium contacts silicon. More specifically, the titanium is reacted over P+ region 855, thereby forming titanium salicide region 856A. The titanium is also reacted over polysilicon gate 847, thereby forming titanium salicide region 856B. Finally, the titanium is reacted over polysilicon plate 853, thereby forming titanium salicide region 856C. This anneal also further activates the P+ ions in P+ region 855. In the described embodiment, this thermal cycle is usually performed using RTA at 850 to 950° C. for 10 to 30 seconds. Note that the thermal cycles performed during the formation of the capacitor structure (i.e., 850–950° C. for 20–60 minutes; 950–1050° C. for 30 to 90 seconds) are greater than the thermal cycles performed during the formation of shallow drain region 855 and metal salicide regions 856A–856C (i.e., 850 to 950° C. for 10 to 15 seconds; 850 to 950° C. for 10 to 30 seconds). In accordance with one embodiment of the present invention, the thermal cycles performed during the formation of the shallow drain region 855 and the metal salicide regions 856A–856C are comparable or less than the thermal cycles performed during the formation of the capacitor structure.

An etch is then performed, thereby removing all unreacted portions of the titanium layer (e.g., those portions located of the titanium layer located over silicon nitride regions 848A–848B and field oxide 845.

The resulting NVM cell 840 is illustrated in FIG. 9J. Polysilicon gate structure 847 and salicide region 856B combine to form salicide gate electrode 810 (FIG. 8). Salicide gate electrode 810 and crown electrode 851 form the floating gate of NVM cell 800. The capacitor structure formed by polysilicon crown 851, ONO structure 852, polysilicon plate 857, and salicide region 856C has a relatively large surface area between polysilicon crown 851 and polysilicon plate 857, because plate 857 extends over both the interior and exterior surfaces of walls 851B, as well as over base region 851A. This relatively large surface area results in a relatively large capacitance for the capacitor structure 802. In addition, because the capacitor structure 802 is formed in a vertical manner, the capacitor consumes a relatively small layout area.

In a conventional logic process, the ability to form good N+ and P+ shallow junctions and salicide is predicated on having minimum thermal cycles after the N+ and P+ implantation and the salicide deposition. By forming the capacitor structure, which typically uses higher thermal cycles, prior to the N+ and P+ implantation and salicide formation, the additional thermal cycles introduced by the formation of the capacitor structure will have minimum effects on the characteristics of transistors fabricated after the capacitor structure.

NVM cell 800 is operated in substantially the same manner as NVM cell 200 (FIG. 2).

Although the present invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A non-volatile memory (NVM) system having a cell comprising:
   a semiconductor region having a first conductivity type;
   a gate dielectric layer located over the semiconductor region;
   a gate electrode located over the gate dielectric layer;
   a source region and a drain region of a second conductivity type, opposite the first conductivity type, located in the semiconductor region and aligned with the gate electrode;
   a crown electrode having a base that directly contacts the gate electrode and walls that extend vertically from the base, away from the gate electrode;
   a dielectric layer located over the crown electrode, wherein the dielectric layer extends over interior surfaces and exterior surfaces of the walls; and
   a plate electrode located over the dielectric layer, wherein the plate electrode extends over at least interior surfaces of the walls.

2. A non-volatile memory (NVM) system having a cell comprising:
   a semiconductor region having a first conductivity type;
   a gate dielectric layer located over the semiconductor region;
   a gate electrode located over the gate dielectric layer;
   a source region and a drain region of a second conductivity type, opposite the first conductivity type, located in the semiconductor region and aligned with the gate electrode;
   a crown electrode having a base that contacts the gate electrode and walls that extend vertically from the base, away from the gate electrode;
   a dielectric layer located over the crown electrode, wherein the dielectric layer extends over at least interior surfaces of the walls;
   a plate electrode located over the dielectric layer, wherein the plate electrode extends over at least interior surfaces of the walls; and
   metal salicide located over the drain region, the source region, the gate electrode and the plate electrode in a self-aligned manner.

3. The NVM system of claim 1, wherein the gate electrode, the crown electrode and the plate electrode comprise polycrystalline silicon.

4. A non-volatile memory (NVM) system having a cell comprising:
   a semiconductor region having a first conductivity type;
   a gate dielectric layer located over the semiconductor region;
   a gate electrode located over the gate dielectric layer;
   a source region and a drain region of a second conductivity type, opposite the first conductivity type, located in the semiconductor region and aligned with the gate electrode;
   a crown electrode having a base that contacts the gate electrode and walls that extend vertically from the base, away from the gate electrode;
   a dielectric layer located over the crown electrode, wherein the dielectric layer extends over at least interior surfaces of the walls;
   a plate electrode located over the dielectric layer, wherein the plate electrode extends over at least interior surfaces of the walls; and
   sidewall spacers formed adjacent to the gate electrode and the crown electrode.

5. A non-volatile memory (NVM) system having a cell comprising:
   a semiconductor region having a first conductivity type;
   a gate dielectric layer located over the semiconductor region;
   a gate electrode located over the gate dielectric layer;
   a source region and a drain region of a second conductivity type, opposite the first conductivity type, located in the semiconductor region and aligned with the gate electrode;
   a crown electrode having a base that contacts the gate electrode and walls that extend vertically from the base, away from the gate electrode;
   a dielectric layer located over the crown electrode, wherein the dielectric layer extends over at least interior surfaces of the walls;
   a plate electrode located over the dielectric layer, wherein the plate electrode extends over at least interior surfaces of the walls; and
   circuitry for removing electrons from the gate electrode by tunneling, the circuitry including a negative voltage generator which provides a negative boosted voltage having a magnitude less than 0.7 Volts.

6. The NVM system of claim 5, further comprising circuitry for selectively coupling the negative voltage generator to the plate electrode.

7. The NVM system of claim 1, further comprising circuitry for injecting electrons into the gate electrode by tunneling.

8. The NVM system of claim 1, further comprising circuitry for refreshing charge stored by the gate electrode.

9. A non-volatile memory (NVM) system having a cell comprising:
   a semiconductor region having a first conductivity type;
   a gate dielectric layer located over the semiconductor region;
   a gate electrode located over the gate dielectric layer;
   a source region and a drain region of a second conductivity type, opposite the first conductivity type, located in the semiconductor region and aligned with the gate electrode;
   a crown electrode having a base that contacts the gate electrode and walls that extend vertically from the base, away from the gate electrode;
   a dielectric layer located over the crown electrode, wherein the dielectric layer extends over at least interior surfaces of the walls;
   a plate electrode located over the dielectric layer, wherein the plate electrode extends over at least interior surfaces of the walls;
   a positive voltage generator which provides a positive boosted voltage having a magnitude greater than a positive supply voltage by an amount less than 0.7 Volts; and
   circuitry for selectively coupling the positive voltage generator to the plate electrode and the semiconductor region.

10. The NVM system of claim 9, further comprising circuitry for selectively coupling the positive voltage generator to at least one of the source region and the drain region.

11. The NYM system of claim 9, further comprising circuitry for applying said positive boosted voltage to the plate electrode during a read operation.

12. The NVM system of claim 9, further comprising circuitry for applying said positive boosted voltage to the semiconductor region during a read operation.

13. The NVM system of claim 9, further comprising circuitry for applying said positive boosted voltage to the plate electrode during a program operation.

14. The NVM system of claim 9, further comprising circuitry for applying said positive boosted voltage to at least one of the source region and the drain region during a read operation.

* * * * *

UNITED STATES PATENT AND TRADEMARK OFFICE
CERTIFICATE OF CORRECTION

PATENT NO. : 6,808,169 B2
DATED : October 26, 2004
INVENTOR(S) : Fu-Chieh Hsu et al.

It is certified that error appears in the above-identified patent and that said Letters Patent is hereby corrected as shown below:

Column 8,
Line 2, replace "arecoupled" with -- are coupled --.

Column 10,
Line 38, replace "Step 708)" with -- (Step 708) --.

Column 16,
Line 65, replace "NYM" with -- NVM --.

Signed and Sealed this

Eleventh Day of October, 2005

JON W. DUDAS
*Director of the United States Patent and Trademark Office*